(12) United States Patent
Ho et al.

(10) Patent No.: US 7,220,619 B2
(45) Date of Patent: May 22, 2007

(54) PROCESS OF CUTTING ELECTRONIC PACKAGE

(75) Inventors: Ming-Lun Ho, Kaohsiung (TW); Ming-Chieh Kao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 113 days.

(21) Appl. No.: 10/904,405

(22) Filed: Nov. 9, 2004

(65) Prior Publication Data

US 2005/0148159 A1    Jul. 7, 2005

(30) Foreign Application Priority Data

Jan. 2, 2004    (TW) .............................. 93100021 A

(51) Int. Cl.
*H01L 21/44* (2006.01)
(52) U.S. Cl. ...................................... 438/113; 438/464
(58) Field of Classification Search ................ 438/106, 438/110, 113, 460, 464; 257/666
See application file for complete search history.

(56) References Cited

U.S. PATENT DOCUMENTS

| | | | |
|---|---|---|---|
| 6,020,218 A * | 2/2000 | Shim et al. ................. | 438/111 |
| 6,087,202 A * | 7/2000 | Exposito et al. ............ | 438/113 |
| 6,310,298 B1 * | 10/2001 | Barrett et al. ............... | 174/250 |
| 6,319,354 B1 * | 11/2001 | Farnworth et al. .......... | 156/344 |
| 7,005,729 B2 * | 2/2006 | Murakami et al. .......... | 257/676 |
| 2002/0020554 A1 * | 2/2002 | Sakamoto et al. .......... | 174/261 |
| 2002/0149092 A1 * | 10/2002 | Lee ............................ | 257/668 |
| 2003/0207498 A1 * | 11/2003 | Islam et al. ................. | 438/120 |
| 2005/0012183 A1 * | 1/2005 | Chow et al. ................ | 257/666 |

* cited by examiner

*Primary Examiner*—Tuan H. Nguyen
(74) *Attorney, Agent, or Firm*—Jianq Chyun IP Office

(57) ABSTRACT

The present invention provides a cutting process for cutting connected electronic package structures. The connected electronic package structures are connected through a mother carrier. Each electronic package structures includes at least an electronic component and a carrier unit, while the mother carrier includes at least a plurality of carrier units and a plurality of cutting regions, each cutting region being disposed between two adjacent carrier units. After forming at least a supporting portion on the first surface of the mother carrier and on a portion of the cutting region of the mother carrier, the mother carrier is positioned to a supportive plane, so that the supporting portion is in contact with the supportive plane. From a second surface of the mother carrier, cutting the mother carrier at the cutting regions, so that the electronic package structures alongside the cutting regions are separated.

14 Claims, 7 Drawing Sheets

PROCESS OF CUTTING ELECTRONIC PACKAGE

CROSS-REFERENCE TO RELATED APPLICATION

This application claims the priority benefit of Taiwan application serial no. 93100021, filed on Jan. 2, 2004.

BACKGROUND OF THE INVENTION

1. Field of Invention

The present invention relates to a process of cutting electronic package. More particularly, the present invention relates to a process of cutting electronic packages, in which the carrier being cut affords a better cutting finish.

2. Description of Related Art

Following the advances in technology and development and growth of electronics industry, broad and extensive applications have been proposed for integrated circuits (ICs). In the semiconductor industry, integrated circuits (ICs) manufacture can be categorized as design of the ICs, fabrication of the ICs, packaging of the ICs and testing of the ICs. Among them, IC packaging has great influences in determining the performance of the ICs. As the pin counts of the ICs keeps increasing, the chip package structure using the lead frame can no longer provide enough leads and the chip package structure using the IC carrier has been employed. The most common IC carrier is the rigid carrier because the rigid carrier can provide contacts in small pitch on the surface and adequate structural strength. For the rigid carrier, the first level packaging technology includes wire bonding and flip chip bonding, and the second level packaging technology includes ball-grid-array (BGA) technology and pin-grid-array (PGA) technology.

FIGS. 1A–1C schematically illustrate the prior art cutting process for the electronic package structure. For the convenience of packaging, a mother carrier 130 comprising a plurality of carrier units is provided before cutting. Each of the electronic package structures 100 includes an electronic component 110 and a carrier unit 120. The electronic component 110 electrically and mechanically connects to the corresponding carrier unit 120. The mother carrier 130 includes at least a cutting region 140, located between two adjacent carrier units 120. The electronic components 110 are disposed on a first surface 132 of the mother carrier 130. The electronic component 110, for example, is a bare die or a wire bonding type chip package structure.

Referring to FIG. 1A, for separating the carrier units 120 (as well as the electronic package structures 100), the mother carrier 130 is placed to a cutting platform (not shown). The back surfaces of the electronic components 110 on the mother carrier 130 are in contact with an UV tape 160 placed on the platform.

Referring to FIG. 1B, the blade 170 is used to cut the mother carrier 130 from the second surface 134, dissecting at the cutting region 140 of the mother carrier 130, so that the electronic package structures 100 beside the cutting region(s) 140 are separated, as shown in FIG. 1C. Since the cutting region 140 of the mother carrier 130 is not in contact with the tape (i.e. not supported by the platform), the cutting edges of the carrier units 120 may have crack or deckle edges as the blade 170 cuts the mother carrier 130 from the second surface 134. Hence, the yield of the cutting process for the electronic package structures is decreased.

SUMMARY OF THE INVENTION

The present invention provides a process of cutting connected electronic package structures, which improves the yield of the cutting process. By using the cutting process of this invention, the cutting edges of the carrier substrate being cut are smooth and even.

As embodied and broadly described herein, the present invention provides a cutting process for cutting connected electronic package structures. The connected electronic package structures are connected through a mother carrier. Each electronic package structures includes at least an electronic component and a carrier unit, while the mother carrier includes at least a plurality of carrier units and a plurality of cutting regions, each cutting region being disposed between two adjacent carrier units. After forming at least a supporting portion on the first surface of the mother carrier and on a portion of the cutting region of the mother carrier, the mother carrier is positioned to a supportive plane, so that the supporting portion is in contact with the supportive plane. From a second surface of the mother carrier, cutting the mother carrier at the cutting regions, so that the electronic package structures alongside the cutting regions are separated.

According to the embodiments, the supporting portion(s) of these electronic package structures can be in either a strip shape or a frame shape. The supporting portion or portions can be disposed on the supporting regions or cutting regions surrounding the carrier unit or sub-carrier, in a frame form. Alternatively, the supporting portions or portions can be arranged parallel to one another and disposed on the supporting regions or cutting regions at opposite sides of the carrier unit or sub-carrier, in a strip form.

Because the supporting portion(s) can provide supports, crack or breakage of the carrier is greatly reduced during the dicing process. Hence, the cutting edges of the carrier units are smooth and even, and the yield of the cutting process for the electronic package structures is greatly improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
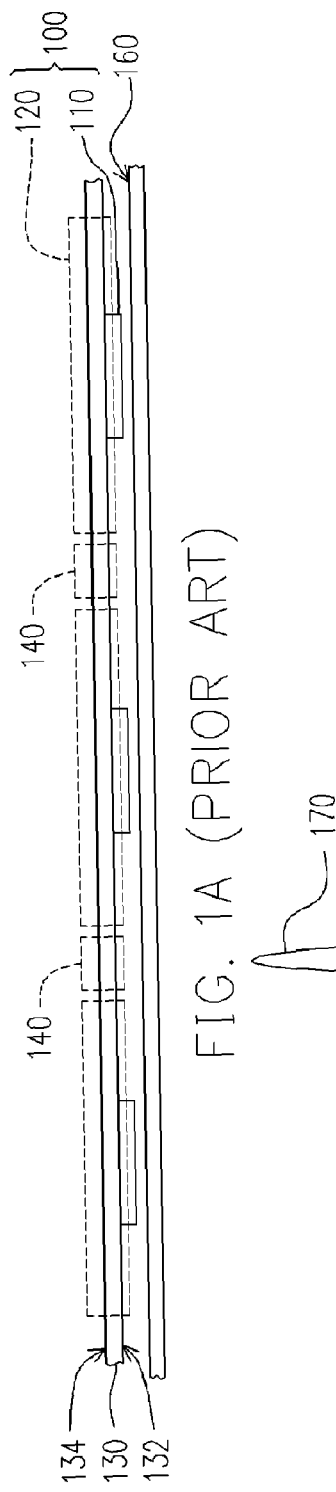
FIGS. 1A–1C schematically illustrate the prior art cutting process for the electronic package structure.
Figure 1B:
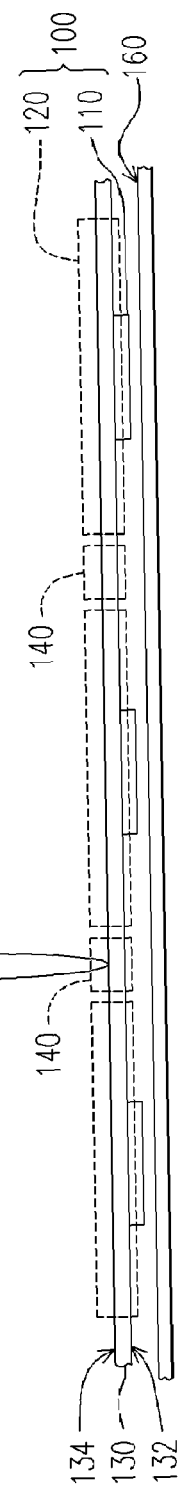
Figure 1C:
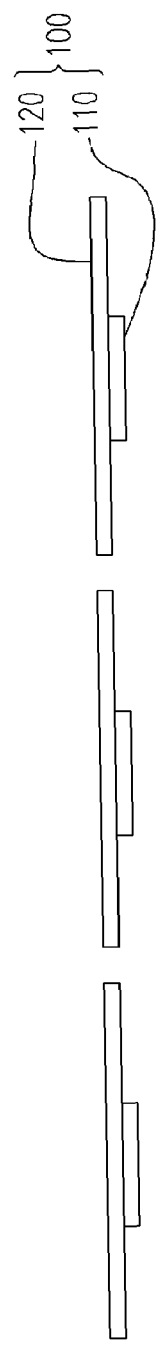

FIGS. 2A–2D schematically illustrate a cutting process for the electronic package structures according to one preferred embodiment of this invention. For the convenience of packaging, a mother carrier 230 comprising a plurality of carrier units 220 is provided before cutting. Each of the electronic package structures 200 includes an electronic component 210 and a carrier unit 220. The electronic component 210 electrically and mechanically connects to the corresponding carrier unit 220. The mother carrier 230 includes a plurality of cutting region 240; each located between two adjacent carrier units 220. The electronic components 210 are disposed on a first surface 232 of the mother carrier 230. The electronic component 210, for example, is a bare die connected to the carrier unit 220 by flip chip bonding.

Figure 2A:
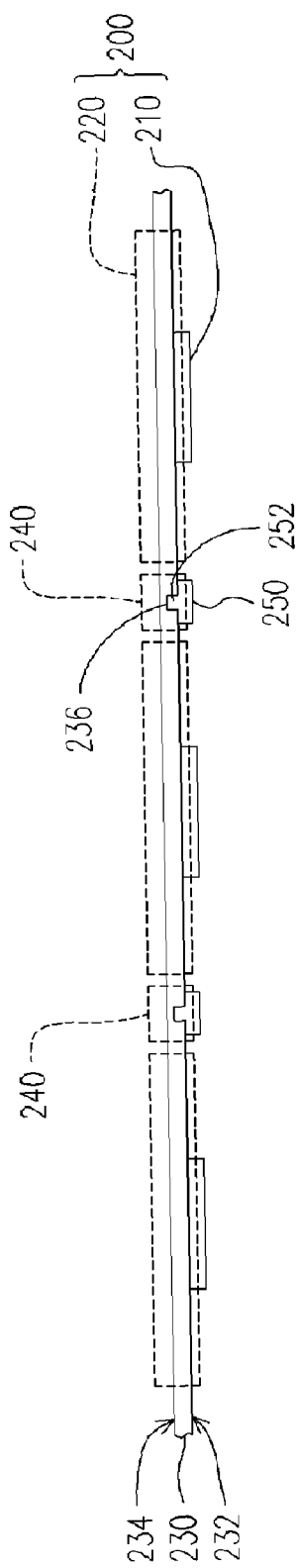
FIGS. 2A–2D schematically illustrate a cutting process for the electronic package structures according to one preferred embodiment of this invention.

Referring to FIG. 2A, a plurality of supporting portions or strips 250 are formed on the cutting regions 240 of the mother carrier 230. The method of forming the supporting portions includes attaching the supporting portions 250 to the cutting regions 240 of the mother carrier 230. Alternatively, as described in the following embodiments, these supporting portions 250 are formed with protrusions 252 that can be set into or wedged into the corresponding positioning holes 236 of the mother carrier 230. Through the protrusions 252 and the positioning hole 236, the supporting portions 250 are tightly fitted to the cutting regions 240 of the mother carrier 230. The material of the supporting portions 250 can be a molding material or epoxy compounds, for example.

Figure 3:
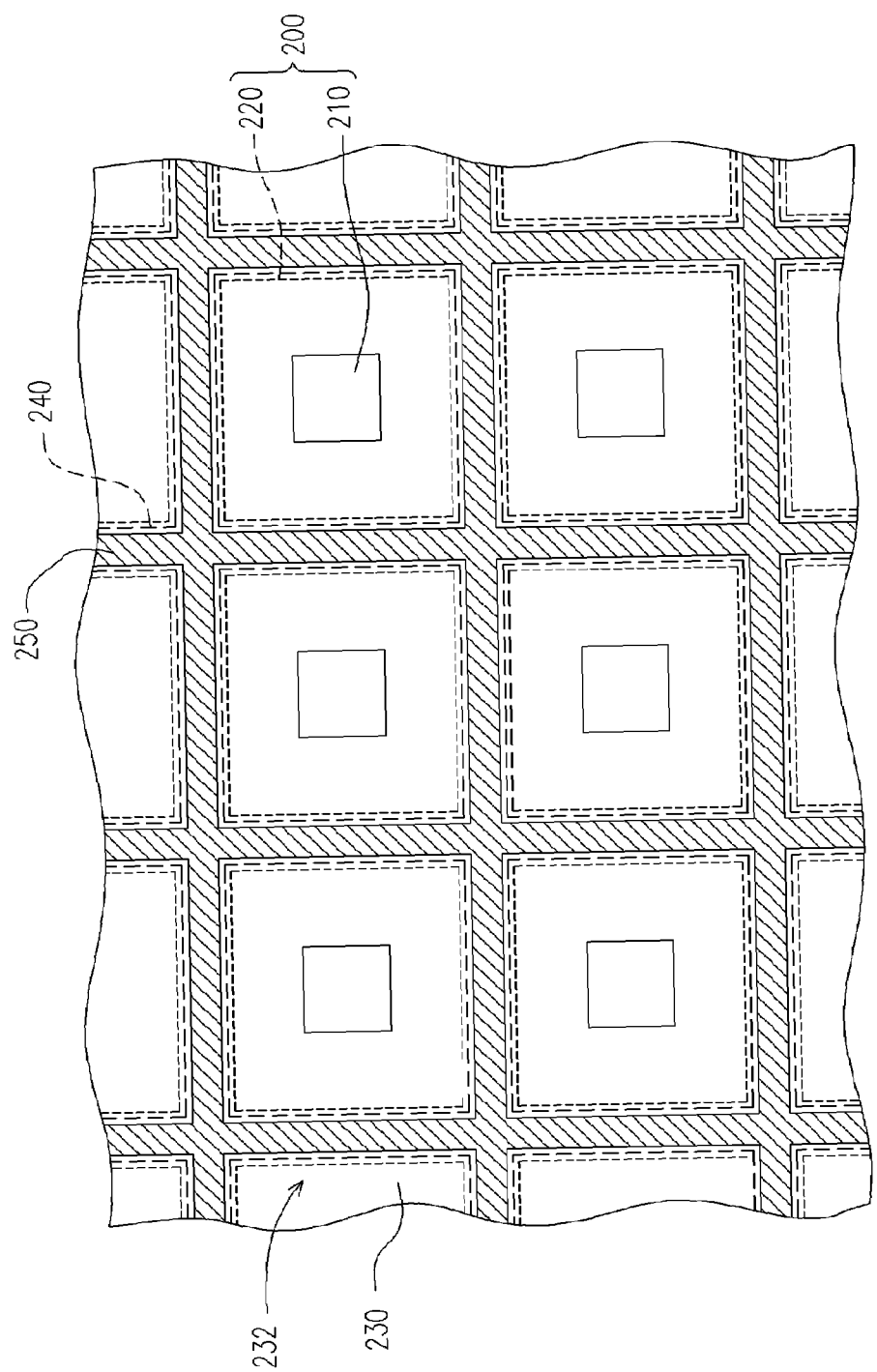
FIG. 3 is a schematic bottom view of the electronic package structures in FIG. 2A according to one preferred embodiment.
Figure 4:
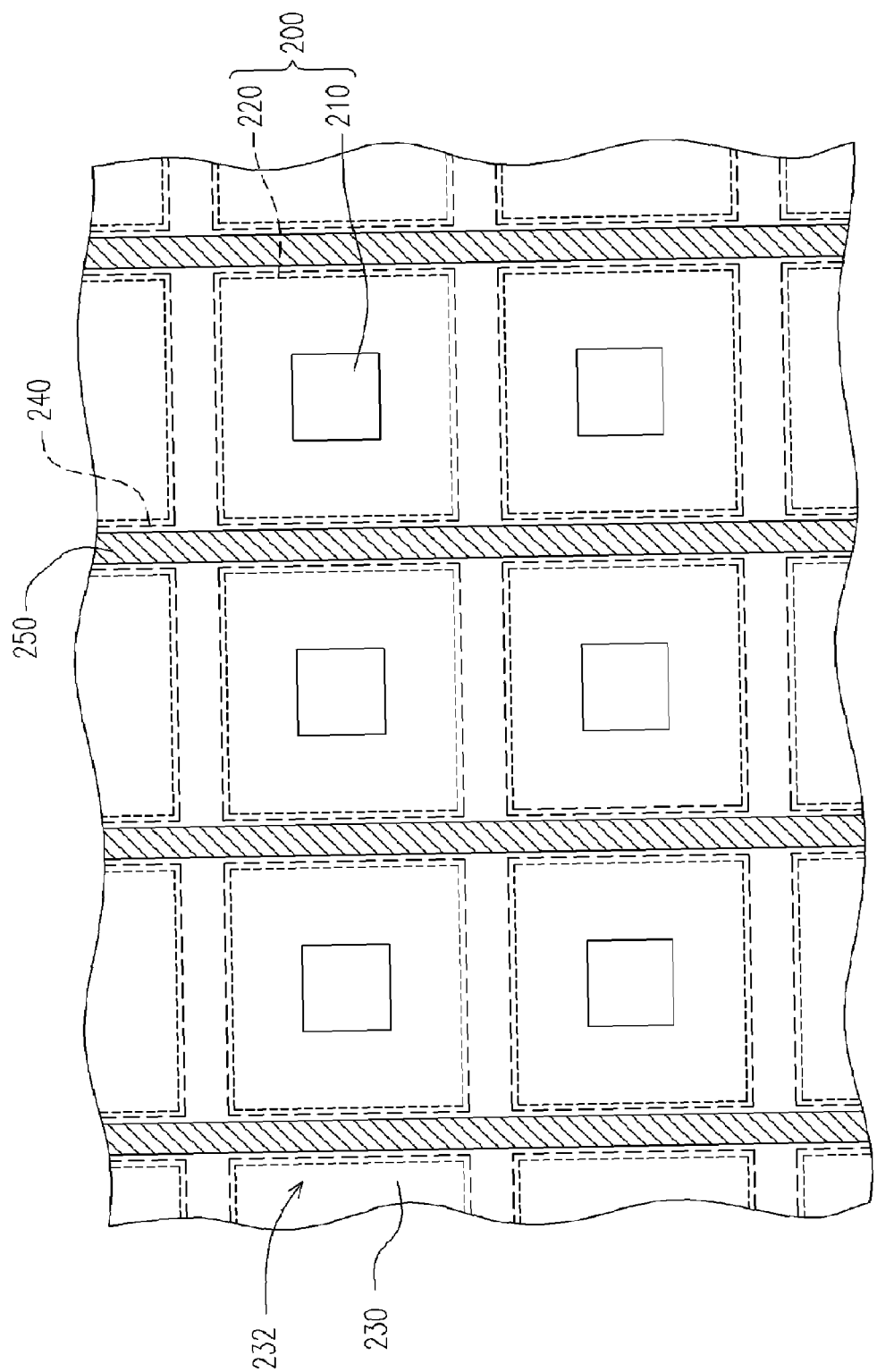
FIG. 4 is a schematic bottom view of the electronic package structures in FIG. 2A according to another preferred embodiment.

FIG. 3 is a schematic bottom view of FIG. 2A according to one preferred embodiment, while FIG. 4 is a schematic bottom view of FIG. 2A according to another preferred embodiment. Referring to FIGS. 2A, 3 and 4, the supporting portions 250 can be disposed on the cutting regions 240 surrounding the carrier units 220 in a frame shape (FIG. 3), or arranged on the cutting regions 240 at opposite sides of the carrier units 220, parallel to one another in strips shape (FIG. 4).

Figure 2B:
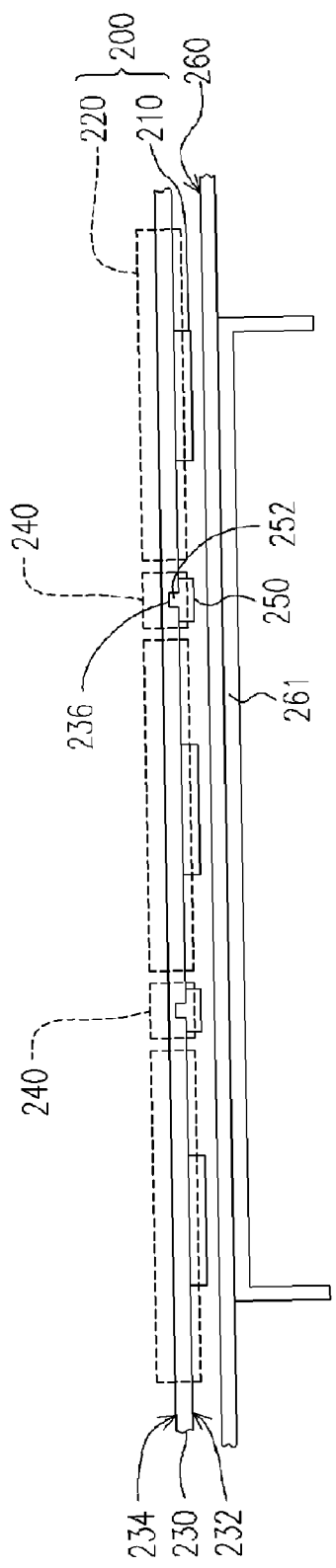

Referring to FIG. 2B, after forming the supporting portions, the mother carrier 230 together with the electronic components thereon are placed to a cutting platform (or a supportive plane) 261. The back surfaces of the supporting portions 250 on the mother carrier 230 are either in contact with or attached to a tape 260, for example, a UV tape, placed on the platform. Since the back surfaces of the supporting portions 250 on the mother carrier 230 are at least in contact with the tape 260 on the platform, the cutting regions 240 are supported by the platform via the supporting portions 250. Also, the back surfaces of the electronic components 220 on the mother carrier 230 are in contact with or attached to the tape 260 placed on the platform. Preferably, the height of the supporting portions 250 relative to the first surface 232 of the mother carrier 230 is about equivalent to or larger than the height of the electronic components 210 relative to the first surface 232 of the mother carrier 230.

Figure 2C:
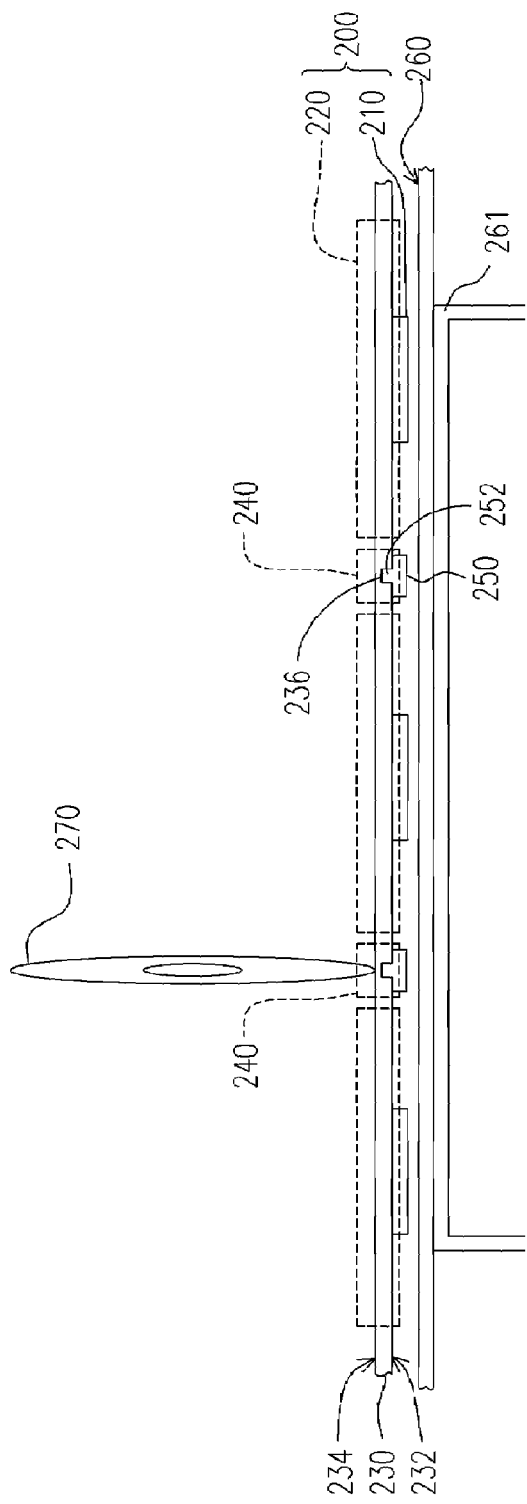
Figure 2D:
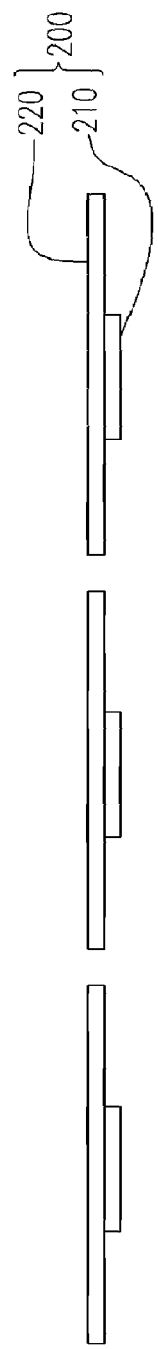

Referring to FIG. 2C, for separating the carrier units 220 (as well as the electronic package structures 200), the blade 270 is used to cut the mother carrier 230 from the second surface 234, dissecting at the cutting regions 240 of the mother carrier 230, so that the electronic package structures 200 beside the cutting region(s) 240 are separated. During the cutting process, not only the cutting regions 240 are cut, but also the supporting portions 250 on the cutting regions 240 are cut. Hence, by cutting the mother carrier 230, electronic package structures 200 that were previously connected by the mother carrier 230 are now separated, as shown in FIG. 2D.

Figure 5:
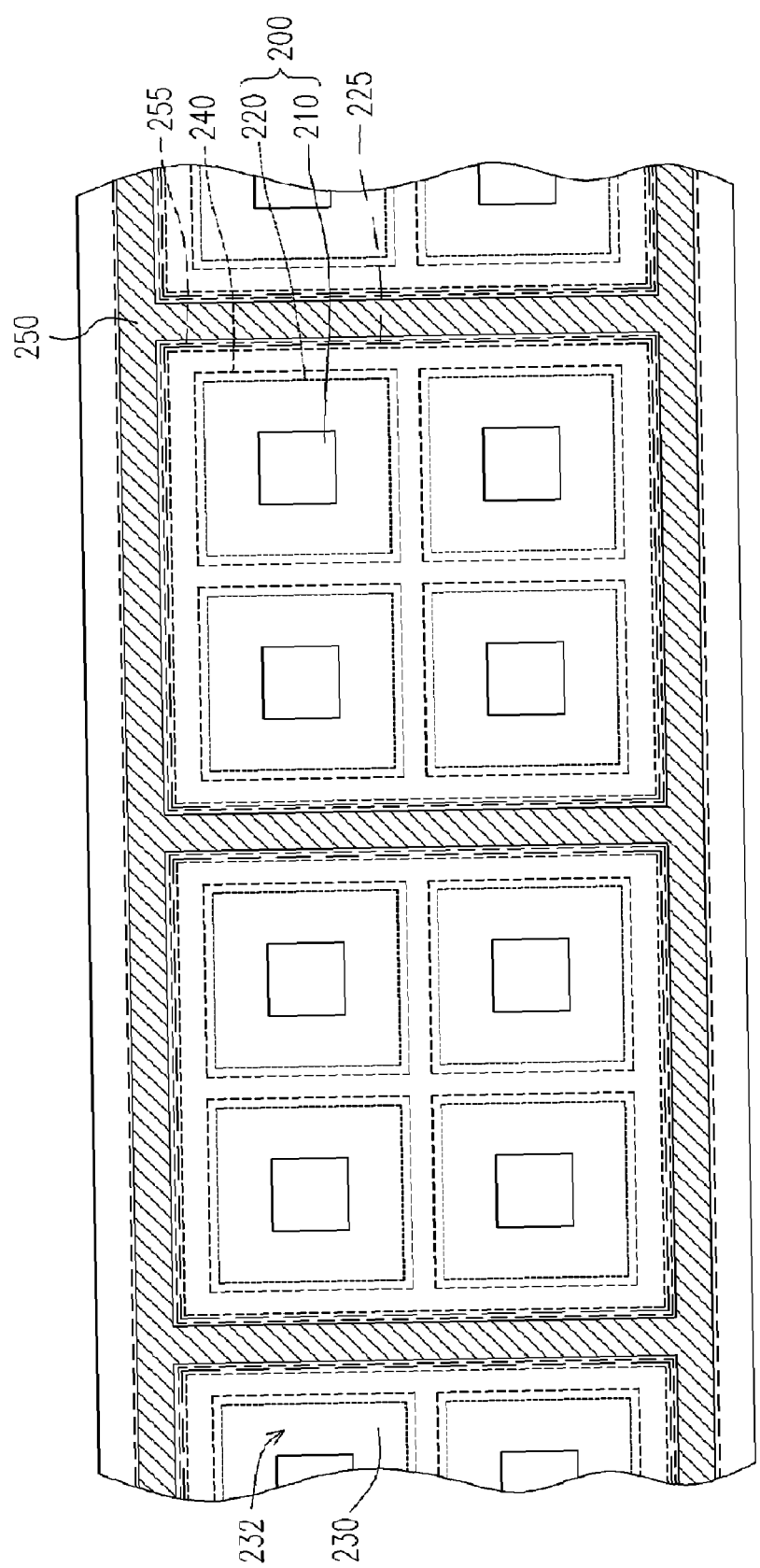
FIG. 5 is a schematic bottom view of the electronic package structures according to the third preferred embodiment.
Figure 6:
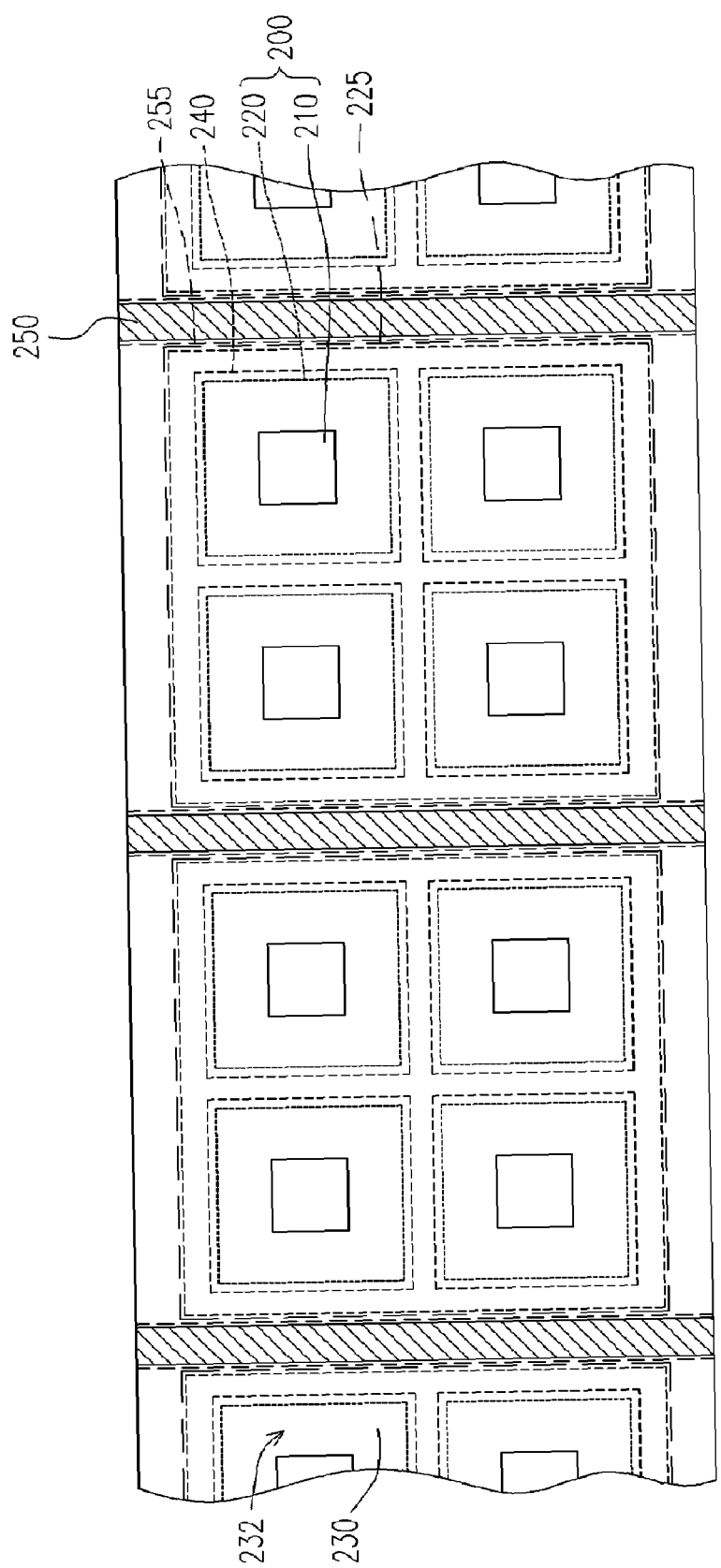
FIG. 6 is a schematic bottom view of the electronic package structures according to the fourth preferred embodiment.

FIG. 5 is a schematic bottom view of the electronic package structures according to the third preferred embodiment, while FIG. 6 is a schematic bottom view of the electronic package structures according to the fourth preferred embodiment. For these electronic package structures 200, the supporting portions 250 can be in either a strip shape or a frame shape. A group of carrier units 220 constitute a sub-carrier 225 and a plurality of sub-carriers 225 constitute the mother carrier 230. The sub-carrier 225 includes a plurality of carrier units; for example, 2×2 carrier units. The mother carrier 230 includes a plurality of cutting regions 240; each located between two adjacent carrier units 220. The mother carrier 230 further includes a plurality of supporting regions 255; each located between two adjacent sub-carriers 225.

As shown in FIG. 5, the supporting portions 250 are disposed on the supporting regions 255 surrounding the sub-carriers 225, in the form of rectangular frames. Alternatively, as shown in FIG. 6, the supporting portions 250 are arranged parallel to one another and disposed on the supporting regions 255 at opposite sides of the sub-carriers 225, in the form of strips. The arrangement of the electronic components is similar as described above, and will not be detailed again.

For the electronic package structures shown in FIGS. 5 and 6, the cutting processes are similar to the cutting processes described in FIGS. 2A–2D. The first surface 232 of the mother carrier 230 is placed to a cutting platform, so that the back surfaces of the supporting portions 250 on the mother carrier 230 are supported by the platform. Then, the blade 270 is used to cut the mother carrier 230 from the second surface 234, dissecting at the cutting regions 240 of the mother carrier 230, so that the electronic package structures 200 beside the cutting region 240 are separated. During the cutting process, not only the cutting regions 240 are cut, but also the supporting portions 250 on the cutting regions 240 are cut. Hence, electronic package structures 200 that were previously connected by the mother carrier 230 are now separated.

It is noted that the supporting portions 250 can be arranged on the cutting regions or the supporting regions. Moreover, the supporting portions 250 can even be arranged on a part of the cutting regions 240 enclosed within the sub-carrier 225. OF course, the number of the carrier units included in the sub-carrier is not limited to 4 (2×2), but can be m×n, where m or n is a nature number and an integer.

In the above embodiment, the supporting portions help to support the mother carrier. Since the cutting regions of the mother carrier are supported by the platform via the protruded supporting portions, the mother carrier will not easily break or crack during cutting. Hence, the cutting edges of the carrier units are smooth and even. Because the carrier units do not have crack or deckle edges after cutting, the yield of the cutting process for the electronic package structures is greatly improved. Because the supporting portions within the package structure provides supports, warpage of the carrier is greatly reduced during the dicing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cutting process for cutting connected electronic package structures, comprising:
    providing a plurality of electronic package structures connected through a mother carrier, wherein the mother carrier includes a plurality of carrier units and a plurality of cutting regions, each of the cutting regions being disposed between each two of the carrier units adjacent to each other, wherein each of the electronic package structures includes at least an electronic component and at least one of the carrier units and each of the electronic components is connected to the corresponding carrier unit, and wherein the electronic components are disposed on a first surface of the mother carrier;
    forming at least a supporting portion on the first surface of the mother carrier and on a portion of the cutting region of the mother carrier, by
        providing the supporting portion having one of at least a protrusion or at least a positioning hole;
        forming the other of the at least a protrusion or the at least a positioning hole on the mother carrier; and
        fitting the protrusion to the positioning hole;
    positioning the mother carrier to a supportive plane, wherein the first surface of the mother carrier faces the supportive plane and the supporting portion is in contact with the supportive plane; and
    cutting the mother carrier at the cutting regions, from a second surface of the mother carrier to remove the cutting regions and the supporting portion, so that the electronic package structures alongside the cutting regions are separated.

2. The process of claim 1, wherein during the step of positioning the mother carrier to the supportive plane, back surfaces of the electronic components are in contact with the supportive plane.

3. The process of claim 1, wherein a height of the supporting portion is equal to or greater than that of the electronic component.

4. The process of claim 1, wherein the electronic component is a chip connected to the carrier unit by flip chip bonding.

5. The process of claim 1, wherein the supporting portion is disposed on the cutting regions surrounding the carrier unit.

6. The process of claim 1, wherein the supporting portion is disposed on the cutting regions at opposite sides of the carrier unit.

7. The process of claim 1, wherein a material of the supporting portion is a molding material.

8. A cutting process for cutting connected electronic package structures, comprising;
    providing a plurality of electronic package structures connected through a mother carrier, wherein the mother carrier includes a plurality of sub-carriers and a plurality of supporting regions, each of the supporting regions being disposed between each two of the sub-carriers adjacent to each other, wherein each of the sub-carriers comprises a plurality of carrier units and a plurality of cutting regions, each or the cutting regions being disposed between each two of the carrier units adjacent to each other, wherein each of the electronic package structures includes at least an electronic component and at least one of the carrier units and each of the electronic components is connected to the corresponding carrier unit, and wherein the electronic components are disposed on a first surface of the mother carrier;
    forming at least a supporting portion an the first surface of the mother carrier and on a portion of the supporting regions of the mother carrier corresponding to a portion of the cutting regions, by
        providing the supporting portion having one of at least a protrusion or at least a positioning hole;
        forming the other of the at least a protrusion or the at least a positioning hole on the mother carrier; and
        fitting the protrusion to the positioning hole;
    positioning the mother carrier to a supportive plane, wherein the first surface of the mother carrier faces the supportive plane and the supporting portion is in contact with the supportive plane; and
    cutting the mother carrier at the cutting regions from a second surface of the mother carrier to remove the cutting regions, the supporting regions and the supporting portion, so that the electronic package structures alongside the cutting regions are separated.

9. The process of claim 8, wherein during the step of positioning the mother carrier to the supportive plane, back surfaces of the electronic components are in contact with the supportive plane.

10. The process of claim 8, wherein a height of the supporting portion is equal to or greater than that of the electronic component.

11. The process of claim 8, wherein the electronic component is a chip connected to the carrier unit by flip chip bonding.

12. The process of claim 8, wherein the supporting portion is disposed on the supporting regions surrounding the sub-carrier.

13. The process of claim 8, wherein the supporting portion is disposed on the supporting regions at opposite sides or the sub-carrier.

14. The process of claim 8, wherein a material of the supporting portion is a molding material.

* * * * *